United States Patent
Shouda et al.

(10) Patent No.: US 11,778,776 B2
(45) Date of Patent: Oct. 3, 2023

(54) COOLING STRUCTURE

(71) Applicant: Showa Denko Materials Co., Ltd., Tokyo (JP)

(72) Inventors: Hiroaki Shouda, Tagawa (JP); Takahiro Yamashita, Tagawa (JP); Kazutake Fujisawa, Tagawa (JP)

(73) Assignee: RESONAC CORPORATION, Tokyo (JP)

( * ) Notice: Subject to any disclaimer, the term of this patent is extended or adjusted under 35 U.S.C. 154(b) by 162 days.

(21) Appl. No.: 17/440,058

(22) PCT Filed: Mar. 19, 2020

(86) PCT No.: PCT/JP2020/012485
§ 371 (c)(1),
(2) Date: Sep. 16, 2021

(87) PCT Pub. No.: WO2020/196333
PCT Pub. Date: Oct. 1, 2020

(65) Prior Publication Data
US 2022/0192053 A1    Jun. 16, 2022

(30) Foreign Application Priority Data
Mar. 22, 2019   (JP) .................. 2019-055694

(51) Int. Cl.
*H05K 7/20*   (2006.01)
(52) U.S. Cl.
CPC ..... *H05K 7/20263* (2013.01); *H05K 7/20409* (2013.01); *H05K 7/20927* (2013.01)

(58) Field of Classification Search
None
See application file for complete search history.

(56) References Cited

U.S. PATENT DOCUMENTS

| | | | | |
|---|---|---|---|---|
| 6,019,165 A * | 2/2000 | Batchelder | ............ | H01L 23/467 165/80.4 |
| 6,483,705 B2 * | 11/2002 | Snyder | .................. | H01L 23/427 174/15.1 |
| 7,078,803 B2 * | 7/2006 | Tilton | .................. | H01L 23/4735 361/698 |
| 7,215,545 B1 | 5/2007 | Moghaddam et al. | | |
| 7,477,517 B2 * | 1/2009 | Khanna | .................. | H01L 23/473 361/689 |
| 7,515,416 B2 * | 4/2009 | McBain | ............. | H05K 7/20254 174/15.1 |

(Continued)

FOREIGN PATENT DOCUMENTS

| | | |
|---|---|---|
| JP | 2003-003248 A | 1/2003 |
| JP | 2010-182831 A | 8/2010 |

(Continued)

*Primary Examiner* — Courtney L Smith
(74) *Attorney, Agent, or Firm* — FITCH, EVEN, TABIN & FLANNERY

(57) ABSTRACT

A cooling structure including a flow path configuration member made of resin and forming a flow path through which a refrigerant flows, a heat diffuser having a plate shape, including a metal, and being embedded in the flow path configuration member or joined to the flow path configuration member, and one or more cooling fins extending from the heat diffuser into the flow path and having a surface made of resin.

20 Claims, 6 Drawing Sheets

(56) References Cited

U.S. PATENT DOCUMENTS

| | | | |
|---|---|---|---|
| 8,908,374 B2* | 12/2014 | Takatsuka | H05K 7/209 |
| | | | 361/679.54 |
| 9,064,846 B2* | 6/2015 | Nagai | H01L 23/473 |
| 9,750,159 B2* | 8/2017 | Campbell | H05K 7/20809 |
| 10,743,442 B2* | 8/2020 | Joshi | H05K 7/20272 |
| 11,350,517 B2* | 5/2022 | Yahara | H05K 7/2089 |
| 2010/0025105 A1* | 2/2010 | Hirschfeld | H02B 1/20 |
| | | | 174/72 B |
| 2013/0009168 A1* | 1/2013 | Tsuchiya | H01L 23/473 |
| | | | 257/77 |

FOREIGN PATENT DOCUMENTS

| | | |
|---|---|---|
| JP | 2012-009498 A | 1/2012 |
| JP | 2013-016615 A | 1/2013 |
| WO | 2016/080333 A1 | 5/2016 |

* cited by examiner

COOLING STRUCTURE

CROSS-REFERENCE TO RELATED APPLICATIONS

This application is a U.S. national phase application filed under 35 U.S.C. § 371 of International Application No. PCT/JP2020/012485, filed Mar. 19, 2020, designating the United States, which claims priority from Japanese Patent Application No. 2019-055694, filed Mar. 22, 2019, the entire contents of each of which are hereby incorporated herein by reference.

TECHNICAL FIELD

The present invention relates to a cooling structure.

BACKGROUND ART

A vehicle equipped with a motor, such as a hybrid car or an electric car is equipped with a driving means that drives the motor. The driving means includes electronic components such as a power module including a plurality of power semiconductors such as an insulated gate bipolar transistor (IGBT), and a capacitor, and a bus bar electrically joining these electronic components.

When the motor is driven, a large current may flow through the power semiconductor, the capacitor, and the bus bar joining these electronic components. In this case, the driving means generates heat due to switching loss, resistance loss, or the like, and therefore needs to be cooled efficiently.

As a cooling means for cooling the driving means, a heat sink including a metal such as aluminum or copper is used because of its high thermal conductivity (see, for example, Patent Literature 1).

CITATION LIST

Patent Literature

Patent Literature 1: Japanese Patent Application Laid-Open (JP-A) No. 2010-182831

SUMMARY OF INVENTION

Technical Problem

However, in order to manufacture a metal heat sink, it is necessary to perform complicated manufacturing processes such as extrusion molding, skiving, and caulking. Thus, the metal heat sink tends to be expensive.

In addition, many man-hours may be required to incorporate a metal heat sink into a cooling target such as a driving means. Therefore, there is a demand for a resin cooling means that is easy to process and easy to incorporate into a driving means or the like.

However, a resin cooling means, which is inferior in thermal conductivity to a metal heat sink, has room for improvement in cooling efficiency.

An aspect of the present invention has been made in view of the above conventional circumstances, and an object of the present invention is to provide a cooling structure made of resin and having excellent cooling efficiency.

Solution to Problem

Specific means for achieving the above-mentioned problems are as follows.

<1> A cooling structure, comprising:
a flow path, comprising:
a flow path configuration member made of resin and forming a flow path through which a refrigerant flows;
a heat diffuser having a plate shape, including a metal, and being embedded in the flow path configuration member or joined to the flow path configuration member; and
one or more cooling fins extending from the heat diffuser into the flow path and having a surface made of resin.
<2> The cooling structure according to <1>, wherein the one or more cooling fins are made of resin or have a metal core material, a surface of which is covered with resin.
<3> The cooling structure according to <1> or <2>, wherein the heat diffuser has a mesh shape or includes a punching metal.
<4> The cooling structure according to any one of <1> to <3>, wherein:
the metal configuring the heat diffuser is at least one selected from the group consisting of aluminum, iron, copper, gold, silver, and stainless steel, and
the resin configuring the one or more cooling fins is at least one selected from the group consisting of a polyphenylene sulfide-based resin, a polyamide-based resin, a polyphthalamide-based resin, a polybutylene terephthalate-based resin, a phenol-based resin, and an epoxy-based resin.
<5> The cooling structure according to any one of <1> to <4>, wherein the heat diffuser has a main surface facing the flow path.
<6> The cooling structure according to <5>, wherein a ratio of a total sectional area of the one or more cooling fins extending from the heat diffuser into the flow path in a direction parallel to the main surface of the heat diffuser, to an area of the main surface of the heat diffuser, is 30% or more.
<7> The cooling structure according to any one of <1> to <6>, wherein a minimum distance h from a surface of the heat diffuser on a side of the flow path to an inner wall of the flow path configuration member is from 0.3 mm to 2.5 mm.
<8> The cooling structure according to any one of <1> to <7>, comprising a cooling target that is cooled by transferring heat to the heat diffuser.
<9> The cooling structure according to any one of <1> to <8>, wherein the flow path configuration member has an outer wall that is at least partially provided with a metal layer.
<10> The cooling structure according to <9>, wherein the metal layer includes a sprayed metal layer.

Advantageous Effects of Invention

An aspect of the present invention can provide a cooling structure made of resin and having excellent cooling efficiency.

DESCRIPTION OF EMBODIMENTS

<Cooling Structure>

Figure 1:
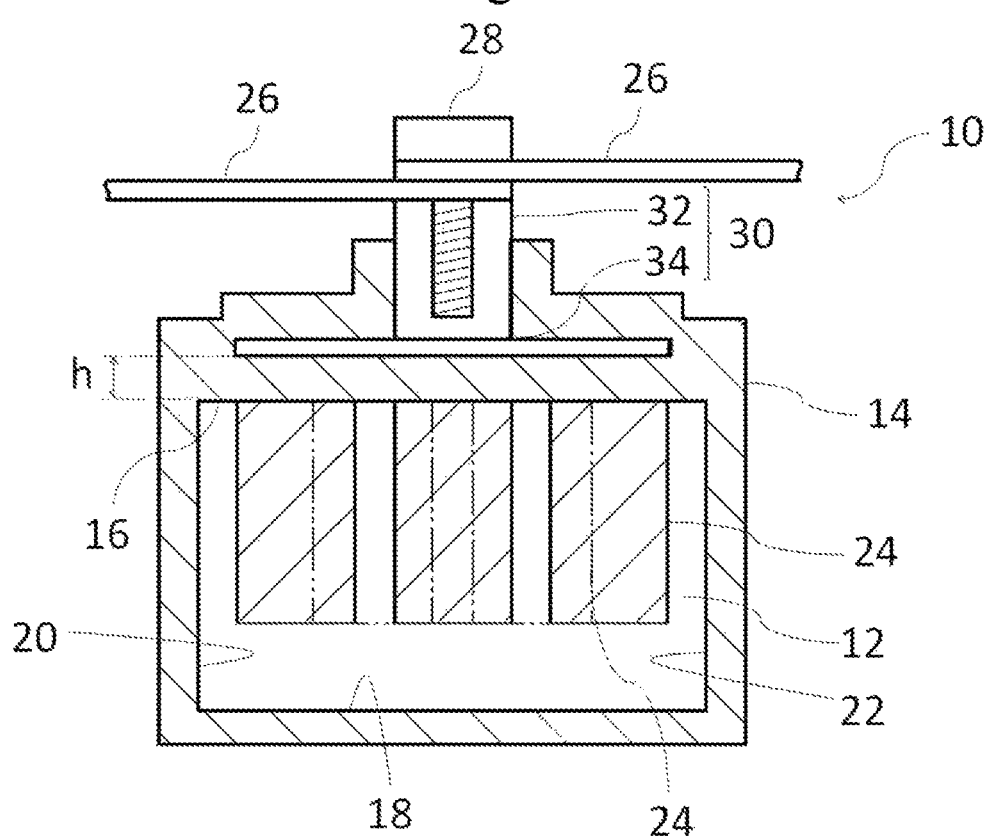
FIG. 1 is a diagram illustrating a cross section of a main part of an embodiment of a cooling structure.

A cooling structure according to the present disclosure includes a flow path configuration member made of resin and forming a flow path through which a refrigerant flows, a heat diffuser having a plate shape, including a metal, and being embedded in the flow path configuration member or joined to the flow path configuration member, and one or more cooling fins extending from the heat diffuser into the flow path and having a surface made of resin. The cooling structure according to the disclosure includes the heat diffuser having a plate shape and including metal, and the cooling fin extending from the heat diffuser into the flow path and having a surface made of resin. Thus, heat received by the heat diffuser having excellent thermal conductivity is diffused in a plane direction of the heat diffuser having a plate shape, and the heat diffused in a wide range is dissipated from the surface of the cooling fin having excellent heat dissipation. As a result, the cooling structure according to the disclosure has more excellent cooling efficiency than a resin cooling means made of a resin member having a plate shape and a resin cooling fin extending from the resin member into a flow path.

Hereinafter, the cooling structure of the disclosure will be described with reference to the drawings. Note that sizes of members in the drawings are conceptual, and a relative relationship between the sizes of the members is not limited to the relationship disclosed herein. In addition, members having substantially the same functions are denoted by the same reference signs throughout the drawings, and redundant description may be omitted.

A cooling structure 10 illustrated in FIG. 1 includes a flow path configuration member 14 that is made of resin and forms a flow path 12 through which a refrigerant flows. The flow path may have a substantially rectangular cross section as illustrated in FIG. 1, or may have a circular cross section, an elliptical cross section, a polygonal cross section other than a rectangular cross section, or the like.

The flow path 12 is surrounded by an upper inner wall 16 corresponding to an inner wall of one of a pair of opposing inner walls, a lower inner wall 18 corresponding to an inner wall of the other one of the pair of opposing inner walls, and a side inner wall 20 and a side inner wall 22 that connect the upper inner wall 16 and the lower inner wall 18.

On the upper inner wall 16 side, a plurality of cylindrical cooling fins 24 extends from a plate-shaped metal heat diffuser 34 to inside of the flow path 12. The cooling fins 24 are made of resin similarly to the flow path 12. In FIG. 1, a part of each cooling fin 24 is indicated by imaginary lines.

On a side opposite to a side on which the cooling fins 24 of the heat diffuser 34 extend, the bus bar 26 as a cooling target cooled by transferring heat to the heat diffuser 34 is fixed by a bolt 28 and a nut 30. The nut 30 includes a nut body 32 and the heat diffuser 34 provided on a side opposite to a side into which the bolt 28 of the nut body 32 is inserted. The heat diffuser 34 has a rectangular plate shape and is integrated with the nut body 32.

The bus bar 26 is connected to electronic components (not illustrated) such as a power semiconductor and a capacitor.

The entire heat diffuser 34 of the nut 30 and the side of the nut body 32 opposite to the side where the bolt 28 is inserted are embedded in the flow path configuration member 14. The heat diffuser is not limited to be embedded in the flow path configuration member, and may be joined to the flow path configuration member, for example, may be joined to an outer wall of the flow path configuration member without being in contact with the flow path. For example, the heat diffuser may be joined to the flow path configuration member by a resin metal joining technique by laser roughening.

All of the plurality of cooling fins 24 extend from the heat diffuser 34 into the flow path 12. As a result, the heat diffused in a plane direction by the heat diffuser 34 is easily dissipated by the cooling fins 24.

Figure 2:
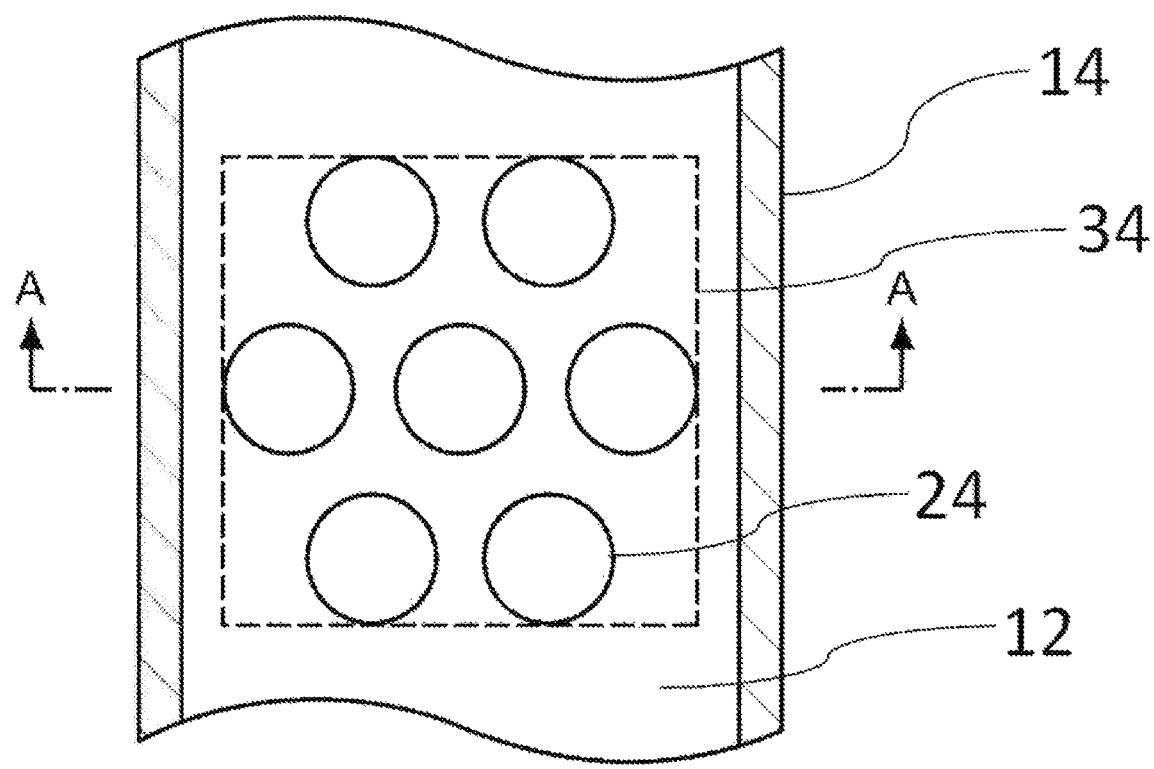
FIG. 2 is a diagram illustrating an example of a region in which cooling fins 24 are provided in a cooling structure 10.

FIG. 2 is a diagram of a region in which the cooling fins 24 is provided in the cooling structure 10 illustrated in FIG. 1, as viewed from an insertion direction of the bolt 28. In order to facilitate understanding of a positional relationship between the cooling fins 24 and the heat diffuser 34, the bus bar 26 and the like are omitted in FIG. 2. In order to facilitate understanding of the positional relationship between the cooling fins 24 and the heat diffuser 34, the heat diffuser 34 is indicated by a dotted line. FIG. 1 is a sectional view taken along line AA illustrated in FIG. 2.

As illustrated in FIG. 2, the number of cooling fins 24 is seven, and the cooling fins 24 are provided in a range where the heat diffuser 34 is disposed. The heat diffuser 34 has a main surface that faces the flow path 12.

Here, when a current flows through the bus bar 26, the bus bar 26 itself generates heat due to a resistance loss. The bus bar 26 is connected to the electronic components (not illustrated), and heat generated from the electronic components by energization is diffused through the bus bar 26. The bus bar 26 is therefore likely to have high temperature.

The heat generated from the bus bar 26 itself and the heat diffused through the bus bar 26 are transferred to a portion integrated with the nut body of the heat diffuser 34 via the bolt 28 and the nut body 32. Since the heat diffuser 34 has a rectangular plate shape, the heat transferred to the heat diffuser 34 is diffused in the plane direction of the heat diffuser 34 and can be diffused in a wide range.

The heat diffuser 34 is disposed at a root of the cooling fins 24, and the heat diffused to the heat diffuser 34 reaches the root of the cooling fins 24 via the flow path configuration member 14. The heat reaching the root of the cooling fins 24 moves from the root of the cooling fins 24 toward the inside of the flow path 12 through the cooling fins 24. At this time, the heat is transferred from the cooling fins 24 to the refrigerant by the refrigerant flowing through the flow path 12. The cooling target such as the bus bar 26 is cooled in this way.

In the cooling structure 10, the cooling fins 24 do not reach the lower inner wall 18 from the upper inner wall 16, and distal ends of the cooling fins 24 are located in the flow path 12. The distal ends of the cooling fins 24 may be in contact with the lower inner wall 18 in terms of increasing the amount of refrigerant in contact with the cooling fins 24 to enhance the cooling efficiency of the cooling structure 10. In addition, in a case in which the distal ends of the cooling fins 24 are in contact with the lower inner wall 18, for example, when a load is applied from the upper inner wall 16 toward the lower inner wall 18 (or from the lower inner wall 18 toward the upper inner wall 16), a strength of the cooling structure 10 can be increased.

In FIG. 1, when the region of the flow path 12 where the cooling fins 24 are provided is observed from upstream in a direction in which the refrigerant flows, an area (area ratio A) of the observed part of the cooling fins 24 in an area of the flow path 12 is preferably 30% or more, more preferably 70% or more, and still more preferably 100%, in terms of improving the cooling efficiency.

In FIG. 1, a minimum distance h from a surface of the heat diffuser 34 on a side of the flow path 12 to the inner wall of the flow path configuration member 14 is preferably 0.3 mm or more in terms of insulating properties, and more preferably 0.5 mm or more and still more preferably 1.5 mm or more in terms of moldability. The minimum distance h is preferably 2.5 mm or less in terms of the cooling efficiency.

In FIG. 2, a ratio (area ratio B) of a total sectional area of cooling fins 24 extending from the heat diffuser 34 into the flow path 12 in a direction parallel to the main surface of the heat diffuser 34 to an area of the main surface of heat diffuser 34 is preferably 30% or more, and more preferably 70% or more in terms of improving the cooling efficiency. In terms of resistance in the flow path 12, the area ratio B is preferably 70% or less, and more preferably 30% or less.

In FIG. 2, the heat diffuser 34 has a rectangular plate shape, but is not limited to a rectangle, and may be a circle, an ellipse, a polygon other than a rectangle, or the like.

At least a surface of the cooling fins 24 needs to be made of resin, and the entire cooling fins 24 may be made of resin, or the cooling fins may have a metal rod-shaped core material of a surface of which is covered with resin. One end of the core material may be connected to the heat diffuser 34 in terms of improving the cooling efficiency.

In FIG. 1, the distal ends of the cooling fins 24 have a flat shape orthogonal to an extending direction of the cooling fins 24, but a shape of the distal ends of the cooling fins 24 is not limited, and may be hemispherical, conical, pyramidal, or the like.

Examples of the cooling target include electronic components such as a power semiconductor and a capacitor in addition to the bus bar 26. In a case in which the cooling target is an electronic component, the cooling fins may be provided at a portion where the electronic component is disposed in the cooling structure.

The number of cooling fins 24 extending from the heat diffuser 34 into the flow path 12 may be one or two or more.

Figure 3:
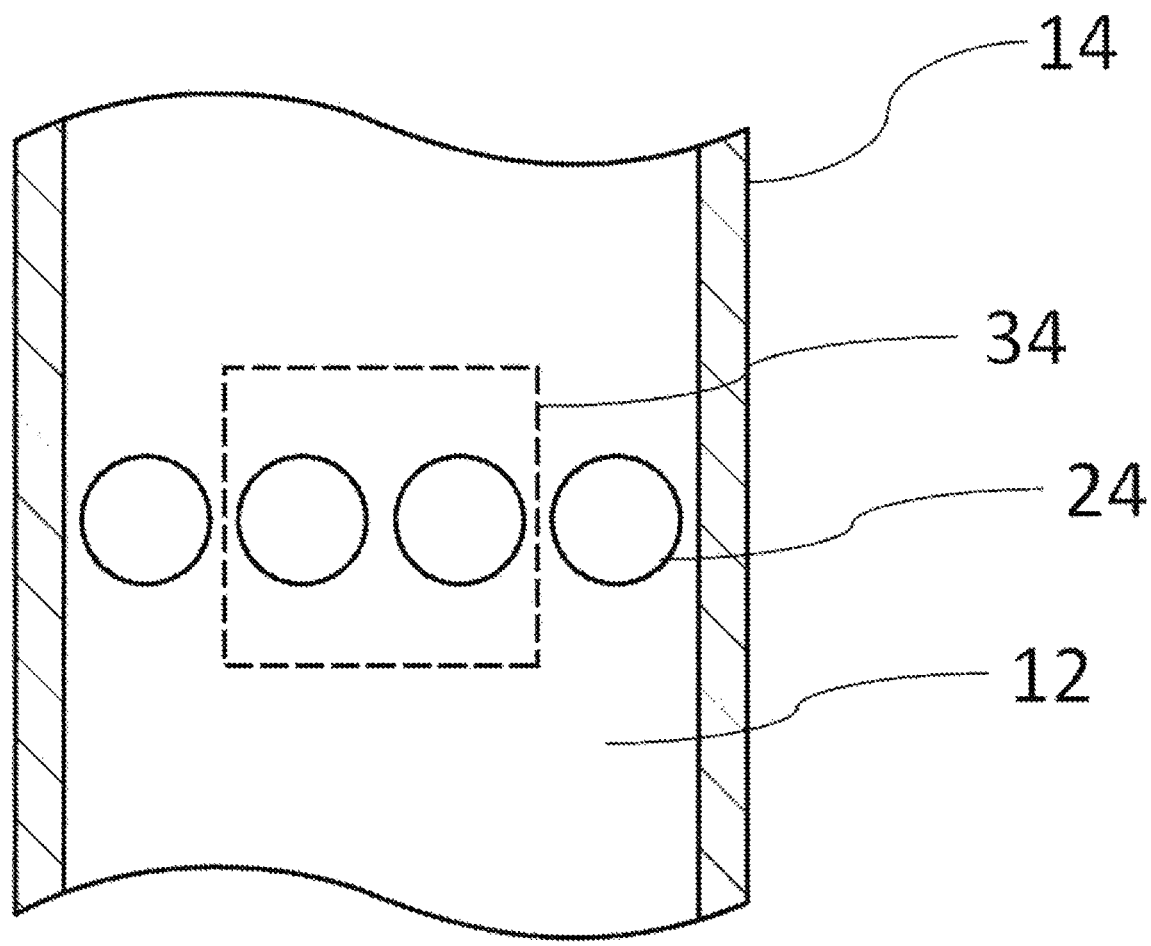
FIG. 3 is a diagram illustrating another example of the region in which the cooling fins 24 are provided in the cooling structure 10.

For example, as illustrated in FIG. 3, the cooling fins 24 may be disposed at a position away from the heat diffuser 34.

Modification of Cooling Structure

In a modification of the cooling structure according to the disclosure, a metal layer is provided on at least a part of the outer wall of the flow path configuration member, a power semiconductor, a capacitor, or the like as the cooling target is preferably disposed on the outer wall of the flow path configuration member, and the metal layer is provided such that at least a part of the cooling target is in contact with the metal layer. Since the metal layer is provided such that at least a part of the cooling target is in contact with the metal layer, the heat generated in the cooling target moves to the refrigerant flowing through the flow path via the metal layer, and thus the cooling target can be efficiently cooled.

Figure 4:
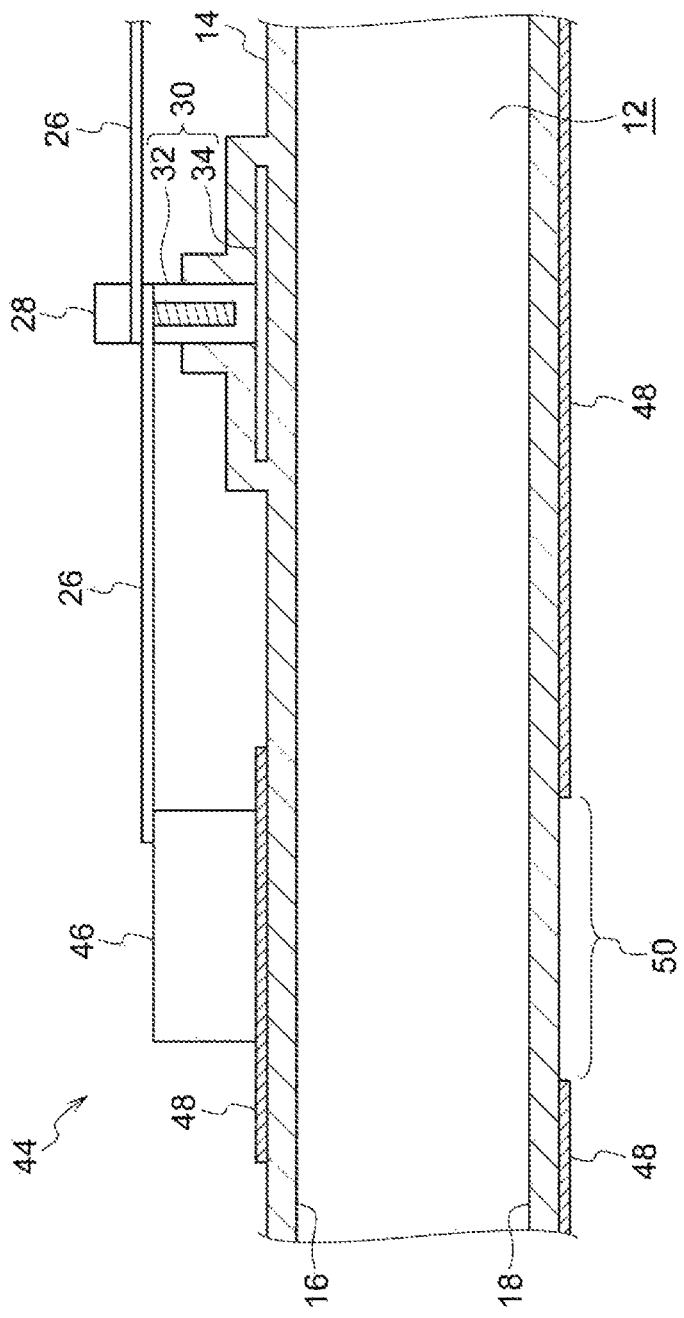
FIG. 4 is a sectional view illustrating a main part of a modification of the cooling structure.

Hereinafter, the modification of the cooling structure according to the disclosure will be described with reference to FIG. 4. FIG. 4 is a sectional view illustrating a main part of the modification of the cooling structure. FIG. 4 illustrates a cross section of a cooling structure 44, parallel to a direction in which the refrigerant flows through the flow path 12. In FIG. 4, the description of the cooling fins is omitted.

In the cooling structure 44 illustrated in FIG. 4, a power semiconductor 46 as a cooling target is in contact with the flow path configuration member 14 with the metal layer 48 provided on the outer wall of the flow path configuration member 14 interposed therebetween. A bus bar 26 is connected to the power semiconductor 46 to ensure conduction with other power semiconductors (not illustrated), other electronic components, and the like. The cooling fins (not illustrated) extend from the upper inner wall 16 toward the lower inner wall 18 at a portion where the flow path configuration member 14 is in contact with the power semiconductor 46. That is, the power semiconductor 46 is disposed at the root of the cooling fins (not illustrated).

Heat generated from the power semiconductor 46 reaches the outer wall of the flow path configuration member 14 via the metal layer 48, and further, the heat reaching the root of the cooling fins (not illustrated) moves from the root of the cooling fins toward the lower inner wall 18 through the cooling fins. At this time, the heat is transferred from the cooling fins to the refrigerant by the refrigerant flowing through the flow path 12. Since the power semiconductor 46 is in contact with the flow path configuration member 14 with the metal layer 48 interposed therebetween, the heat generated from the power semiconductor 46 is likely to efficiently move to the cooling fins, and the cooling efficiency is improved.

In addition, the metal layer 48 can shield a magnetic field in a low frequency range (in particular, a radio band) generated from the power semiconductor 46. It is therefore effective to provide the metal layer 48 on the outer wall of the flow path configuration member 14 in terms of magnetic field shielding. The metal layer 48 only has to be provided on at least a part of the outer wall of the flow path configuration member 14. Note that, the metal layer 48, which is conductive, does not have to be provided at a portion where insulating properties are required. In addition, the metal layer 48 may be formed on the outer wall of the flow path configuration member 14, and the metal layer 48 at the portion where insulating properties are required may be covered with a resin layer.

The metal layer 48 is preferably provided, for example, on the outer wall of the flow path configuration member 14 opposite to a side on which the cooling target is disposed. Further, as shown in FIG. 4, when the metal layer 48 is provided on a part of the outer wall of the flow path configuration member 14 on the side where the cooling target is disposed, a region 50 where the metal layer 48 is not provided may exist on the outer wall of the flow path configuration member 14 opposite to the side on which the cooling target is disposed. Further, a region where the metal layer 48 is not provided may exist on the outer wall opposite to a portion where the heat diffuser 34 in FIG. 4 is disposed.

A method of manufacturing the cooling structure according to the disclosure is not limited, and it is possible to adopt a usual method of molding a resin molded body such as an injection molding method, a die slide injection molding method, a blow molding method, a compression molding method, a transfer molding method, an extrusion molding method, or a cast molding method. Note that the die slide injection molding method is preferable because high positional accuracy may be required for manufacturing the cooling structure 10.

A portion of the nut 30 embedded in the flow path configuration member 14 may be separately manufactured by an insert molding method.

The types of the resins configuring the flow path configuration member 14 and the cooling fin 24 are not limited. Examples of the resin include a polyethylene-based resin, a polypropylene-based resin (PP), a composite polypropylene-based resin (PPC), a polyphenylene sulfide-based resin (PPS), a polyphthalamide-based resin (PPA), a polybutylene terephthalate-based resin (PBT), an epoxy-based resin, a phenol-based resins, polystyrene-based resin, a polyethylene terephthalate-based resin, a polyvinyl alcohol-based resin, a vinyl chloride-based resin, an ionomer-based resin, a polyamide-based resin, an acrylonitrile-butadiene-styrene copolymer resin (ABS), and a polycarbonate-based resin. The resins configuring the flow path configuration member 14 and the resin configuring the cooling fin 24 may be the same or different.

The resins configuring the flow path configuration member 14 and the cooling fin 24 may contain an inorganic filler. Examples of the inorganic filler include silica, alumina, zircon, magnesium oxide, calcium silicate, calcium carbonate, potassium titanate, silicon carbide, silicon nitride, boron nitride, beryllia, and zirconia. Furthermore, examples of the inorganic filler having a flame retardant effect include aluminum hydroxide and zinc borate.

The inorganic fillers included in the resins configuring the flow path configuration member 14 and the cooling fin 24 may be the same or different. One of the resins configuring the flow path configuration member 14 or the resin configuring the cooling fin 24 may include an inorganic filler, and the other does not have to include an inorganic filler.

Examples of the metal configuring the heat diffuser 34 include metals such as aluminum, iron, copper, gold, silver, and stainless steel, and alloys thereof.

The heat diffuser 34 may have a mesh shape, a punching metal, or the like in terms of suppressing a load on the cooling structure 10 due to a difference in thermal expansion coefficient between the resins configuring the flow path configuration member 14 and the cooling fin 24 and the metal configuring the heat diffuser 34.

In the cooling structure 10, in terms of the heat diffusibility of the heat diffuser 34 in the plane direction and heat dissipation of the cooling fin 24, the metal configuring the heat diffuser 34 is preferably at least one selected from the group consisting of aluminum, iron, copper, gold, silver, and stainless steel, and the resin configuring the cooling fin 24 is preferably at least one selected from the group consisting of a polyphenylene sulfide-based resin, a polyamide-based resin, a polyphthalamide-based resin, a polybutylene terephthalate-based resin, a phenol-based resin, and an epoxy-based resin. Preferable examples of the polyamide resin include nylon 6 and nylon 66.

The type of the refrigerant flowing through the flow path is not limited. Examples of the refrigerant include a liquid such as water and an organic solvent, and a gas such as air. The water used as the refrigerant may include a component such as an antifreeze liquid.

The component configuring the metal layer 48 is not limited, and examples thereof include zinc, aluminum, a zinc-aluminum alloy, carbon steel, stainless steel, nickel, a nickel alloy, tin, copper, a copper alloy, silver, a silver alloy, gold, a gold alloy, and molybdenum. Among these components, silver and copper are preferable in terms of enhancing a magnetic field shielding effect. On the other hand, silver and gold are preferable in terms of the cooling efficiency of the cooling target.

A method of forming the metal layer 48 is not limited, and examples thereof include electrolytic plating, electroless plating, vapor deposition, attachment of a metal plate, and metal spraying. The metal layer 48 is preferably a sprayed metal layer formed by a metal thermal spraying method in terms of formability, and is preferably zinc in terms of workability.

A thickness of the metal layer 48 is not limited, and is preferably from 1 μm to 2 mm.

An average thickness of the metal layer 48 in contact with the power semiconductor 46 as the cooling target is preferably from 200 μm to 2 mm, and more preferably from 500 μm to 2 mm in terms of the cooling efficiency.

The average thickness of the metal layer 48 provided on the outer wall of the flow path configuration member 14 on the side opposite to the side where the cooling target is disposed is preferably from 1 μm to 2 mm, preferably from 200 μm to 2 mm, and more preferably from 500 μm to 2 mm in terms of magnetic field shielding.

The cooling structure 10 may include a temperature sensor that measures temperature of the refrigerant, and may include a temperature sensor downstream of the region in which the cooling fin 24 extends in the flow path 12. In addition, the amount of the refrigerant may be adjusted in accordance with the temperature of the temperature sensor, or a controller may be provided that adjusts the amount of refrigerant in accordance with the temperature of the temperature sensor.

The cooling structure according to the disclosure is effective for cooling electronic components such as a power module including a plurality of power semiconductors, and a capacitor, and a bus bar electrically joining these electronic components in a vehicle equipped with a motor such as a hybrid vehicle or an electric vehicle.

Example

Hereinafter, magnetic field shielding performance and cooling performance of the metal layer are studied on the basis of an experimental example.

Evaluation of Magnetic Field Shielding Performance

A PPS resin plate having a length of 120 mm, a width of 120 mm, and a thickness of 5 mm was prepared and used as a test piece 1.

A zinc layer having an average thickness of 200 μm was formed on one surface of the test piece 1 by a thermal spraying method. This was used as a test piece 2.

An aluminum plate having a length of 120 mm, a width of 120 mm, and a thickness of 500 μm was used as a test piece 3.

For the test piece 1, the test piece 2, and the test piece 3, the magnetic field shielding performance was evaluated by an apparatus for evaluating a magnetic field shielding effect in a KEC method (from 500 Hz to 1 GHz) described below.

Figure 5:
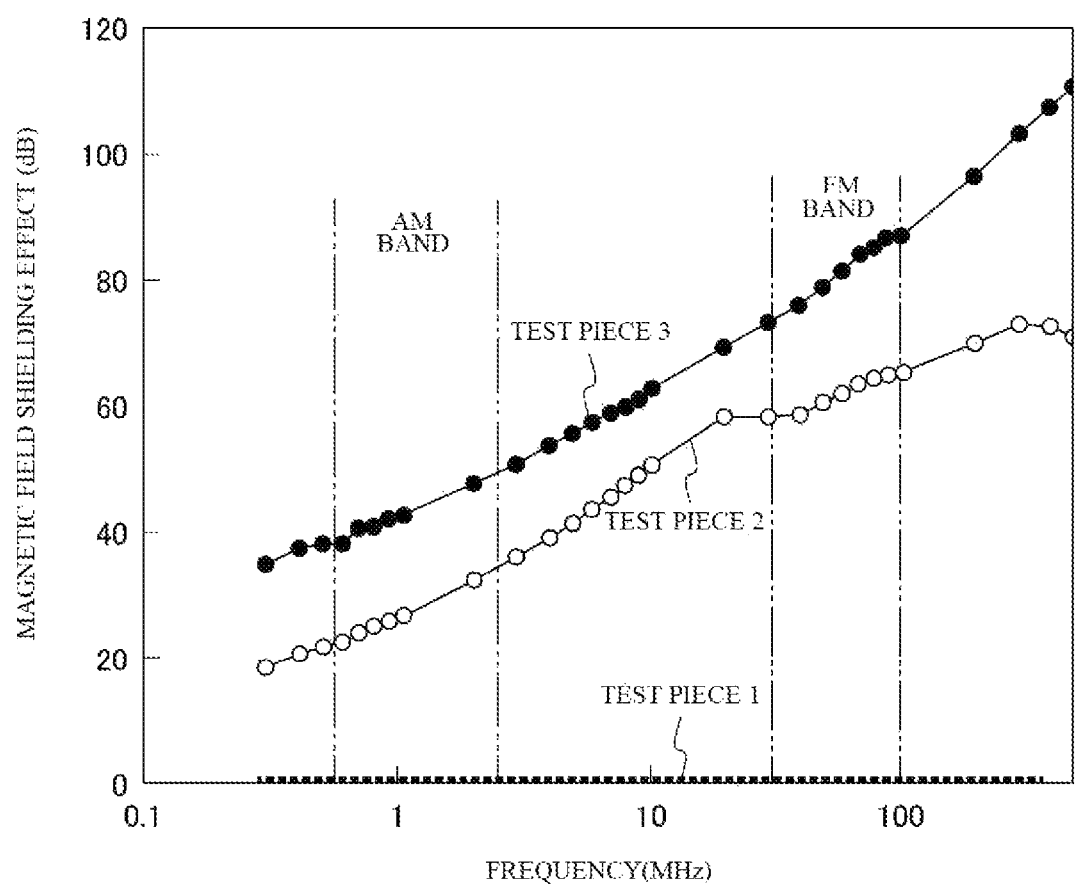
FIG. 5 is a diagram illustrating evaluation results of magnetic field shielding performance of a metal layer.

The obtained results are shown in FIG. 5. As is clear from FIG. 5, it can be seen that the test piece 2 and the test piece 3 show a more excellent magnetic field shielding effect than the test piece 1.

Evaluation of Cooling Performance

A channel model 1 having a rectangular cross section with an outer diameter of 30 mm (width)×15 mm (length), an inner diameter of 25 mm (width)×10 mm (length), and a length of 110 mm was formed with use of a PPS resin. A zinc layer 48 having an average thickness of 200 μm was formed on an upper surface of an outer wall of 110 mm×30 mm of the channel model 1 by the thermal spraying method. This was defined as a channel model 2.

Figure 6:
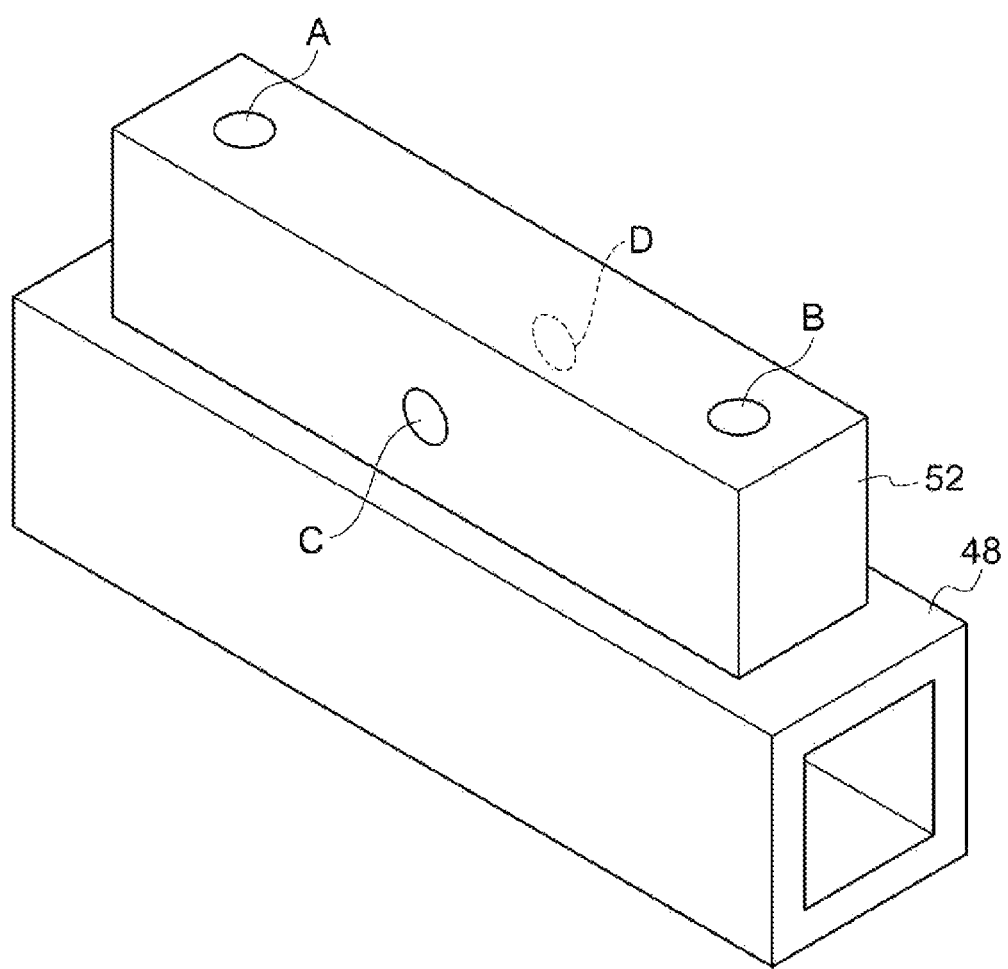
FIG. 6 is a diagram for describing a method of evaluating cooling performance.

On each of the outer wall of 110 mm×30 mm of the channel model 1 and the surface on which the zinc layer 48 of the water channel model 2 was formed, an iron block 52 having a size of 95 mm×25 mm×15 mm and heated to 100° C. was disposed as shown in FIG. 6, and water at 20° C. was circulated in each channel model at a flow rate of 8 L/min.

Temperature changes at a total of four points A to D shown in FIG. 6 were measured with a high-performance recorder GR-3500 manufactured by KEYENCE CORPO- RATION immediately after the iron block 52 was disposed. As a result, the temperature at each measurement point 17 minutes after the iron block 52 was disposed was as shown in Table 1 below, and it became clear that the zinc layer 48 was effective for cooling the cooling target.

TABLE 1

|  |  | Temperature after 10 minutes |
|---|---|---|
| Channel Model 1 | A | 69.2° C. |
|  | B | 69.3° C. |
|  | C | 68.7° C. |
|  | D | 67.4° C. |
| Channel Model 2 | A | 38.9° C. |
|  | B | 40.2° C. |
|  | C | 39.0° C. |
|  | D | 38.4° C. |

The disclosure of Japanese Patent Application No. 2019-055694 filed on Mar. 22, 2019 is incorporated herein by reference in its entirety.

All documents, patent applications, and technical standards described herein are incorporated herein by reference to the same extent as in a case in which each document, patent application, and technical standard are specifically and individually indicated to be incorporated by reference.

REFERENCE SIGNS LIST 10, 44 Cooling structure
12 Flow path
14 Flow path configuration member
16 Upper inner wall
18 Lower inner wall
20 Side inner wall
22 Side inner wall
24 Cooling fin
26 Bus bar
28 Bolt
30 Nut
32 Nut body
34 Heat diffuser
46 Power semiconductor
48 Metal layer
50 Region
52 Iron block

The invention claimed is:

1. A cooling structure, comprising:
 a flow path configuration member made of resin and forming a flow path through which a refrigerant can flow;
 a heat diffuser having a plate shape, including a metal, and being embedded in the flow path configuration member or joined to an outer wall of the flow path configuration member without being in contact with the flow path;
 one or more cooling fins extending from the heat diffuser into the flow path and having a surface made of resin; and
 a bus bar, which is cooled by transferring heat to the heat diffuser, fixed to a side of the heat diffuser opposite to a side of the heat diffuser on which the one or more cooling fins of the heat diffuser extend.

2. The cooling structure according to claim 1, wherein the entirety of the one or more cooling fins is made of resin or the one or more cooling fins have a metal core material, a surface of which is covered with resin.

3. The cooling structure according to claim 1, wherein the heat diffuser has a mesh shape or includes a punching metal.

4. The cooling structure according to claim 1, wherein:
 the metal configuring the heat diffuser is at least one selected from the group consisting of aluminum, iron, copper, gold, silver, and stainless steel, and
 the resin configuring the one or more cooling fins is at least one selected from the group consisting of a polyphenylene sulfide-based resin, a polyimide-based resin, a polyphthalamide-based resin, a polybutylene terephthalate-based resin, a phenol-based resin, and an epoxy-based resin.

5. The cooling structure according to claim 1, wherein the heat diffuser has a main surface facing the flow path.

6. The cooling structure according to claim 5, wherein a ratio of a total sectional area of the one or more cooling fins extending from the heat diffuser into the flow path in a direction parallel to the main surface of the heat diffuser, to an area of the main surface of the heat diffuser, is 30% or more.

7. The cooling structure according to claim 1, wherein a minimum distance h from a surface of the heat diffuser on a side of the flow path to an inner wall of the flow path configuration member is from 0.3 mm to 2.5 mm.

8. The cooling structure according to claim 1, wherein the flow path configuration member has an outer wall that is at least partially provided with a metal layer.

9. The cooling structure according to claim 8, wherein the metal layer includes a sprayed metal layer.

10. The cooling structure according to claim 2, wherein the heat diffuser has a mesh shape or includes a punching metal.

11. The cooling structure according to claim 2, wherein:
 the metal configuring the heat diffuser is at least one selected from the group consisting of aluminum, iron, copper, gold, silver, and stainless steel, and
 the resin configuring the one or more cooling fins is at least one selected from the group consisting of a polyphenylene sulfide-based resin, a polyimide-based resin, a polyphthalamide-based resin, a polybutylene terephthalate-based resin, a phenol-based resin, and an epoxy-based resin.

12. The cooling structure according to claim 3, wherein:
 the metal configuring the heat diffuser is at least one selected from the group consisting of aluminum, iron, copper, gold, silver, and stainless steel, and
 the resin configuring the one or more cooling fins is at least one selected from the group consisting of a polyphenylene sulfide-based resin, a polyimide-based resin, a polyphthalamide-based resin, a polybutylene terephthalate-based resin, a phenol-based resin, and an epoxy-based resin.

13. The cooling structure according to claim 2, wherein the heat diffuser has a main surface facing the flow path.

14. The cooling structure according to claim 3, wherein the heat diffuser has a main surface facing the flow path.

15. The cooling structure according to claim 4, wherein the heat diffuser has a main surface facing the flow path.

16. The cooling structure according to claim 13, wherein a ratio of a total sectional area of the one or more cooling fins extending from the heat diffuser into the flow path in a direction parallel to the main surface of the heat diffuser, to an area of the main surface of the heat diffuser, is 30% or more.

17. The cooling structure according to claim 14, wherein a ratio of a total sectional area of the one or more cooling fins extending from the heat diffuser into the flow path in a direction parallel to the main surface of the heat diffuser, to an area of the main surface of the heat diffuser, is 30% or more.

18. The cooling structure according to claim 15, wherein a ratio of a total sectional area of the one or more cooling fins extending from the heat diffuser into the flow path in a direction parallel to the main surface of the heat diffuser, to an area of the main surface of the heat diffuser, is 30% or more.

19. The cooling structure according to claim 2, wherein a minimum distance h from a surface of the heat diffuser on a side of the flow path to an inner wall of the flow path configuration member is from 0.3 mm to 2.5 mm.

20. The cooling structure according to claim 1, wherein the bus bar is fixed to the side of the heat diffuser opposite to the side of the heat diffuser on which the one or more cooling fins of the heat diffuser extend by a bolt and a nut.

* * * * *